(12) United States Patent
Yang et al.

(10) Patent No.: US 11,256,181 B2
(45) Date of Patent: Feb. 22, 2022

(54) APPARATUS AND METHOD FOR REMOVING PARTICLES IN SEMICONDUCTOR MANUFACTURING

(71) Applicant: Taiwan Semiconductor Manufacturing Co., Ltd., Hsinchu (TW)

(72) Inventors: Yueh-Lin Yang, Tainan (TW); Chi-Hung Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 115 days.

(21) Appl. No.: 16/659,587

(22) Filed: Oct. 22, 2019

(65) Prior Publication Data

US 2021/0033988 A1 Feb. 4, 2021

Related U.S. Application Data

(60) Provisional application No. 62/880,663, filed on Jul. 31, 2019.

(51) Int. Cl.
| | | |
|---|---|---|
| *G03F 7/20* | (2006.01) | |
| *H01L 21/683* | (2006.01) | |
| *B08B 6/00* | (2006.01) | |
| *H01L 21/67* | (2006.01) | |

(52) U.S. Cl.
CPC ............ *G03F 7/70925* (2013.01); *B08B 6/00* (2013.01); *G03F 7/70033* (2013.01); *G03F 7/70708* (2013.01); *G03F 7/70933* (2013.01); *H01L 21/6833* (2013.01); *H01L 21/67167* (2013.01)

(58) Field of Classification Search
CPC ..... B08B 6/00; G03F 7/7003; G03F 7/70708; G03F 7/70841; G03F 7/70866; G03F 7/70908; G03F 7/70916; G03F 7/70925; G03F 7/70933
USPC .............................. 134/1; 355/30, 53, 72, 77
See application file for complete search history.

(56) References Cited

U.S. PATENT DOCUMENTS

| | | | |
|---|---|---|---|
| 2003/0184720 A1* | 10/2003 | Heerens .................. | G03F 7/707 355/53 |
| 2004/0103917 A1* | 6/2004 | Heerens .................... | G03F 1/82 134/7 |
| 2006/0012760 A1* | 1/2006 | Owen ................. | G03F 7/70916 355/30 |
| 2006/0127811 A1* | 6/2006 | Josephina Moors ....................... | G03F 7/70908 430/302 |
| 2008/0257383 A1* | 10/2008 | Levinson .......... | H01L 21/02057 134/6 |

(Continued)

*Primary Examiner* — Colin W Kreutzer
(74) *Attorney, Agent, or Firm* — JCIPRNET

(57) ABSTRACT

A method for removing particles from a semiconductor process chamber including at least the following steps is provided. Electrical charges having a first polarity are accumulated on a receiving surface of the substrate holder by applying a voltage to the substrate holder. The particles having a second polarity in the semiconductor process chamber are attracted to move toward the receiving surface of the substrate holder on which the electrical charges having the first polarity are accumulated, where the first polarity is opposite to the second polarity. The particles having the second polarity are removed from the semiconductor process chamber. Other methods for removing particles from a semiconductor process chamber are also provided.

20 Claims, 12 Drawing Sheets

(56) References Cited

U.S. PATENT DOCUMENTS

| | | | |
|---|---|---|---|
| 2009/0014030 A1* | 1/2009 | De Jong | G03F 7/70341 134/8 |
| 2009/0186282 A1* | 7/2009 | Wu | G03F 7/70858 430/5 |
| 2016/0336196 A1* | 11/2016 | Sim | B08B 6/00 |
| 2019/0201943 A1* | 7/2019 | Maas | G03F 7/70916 |
| 2020/0096880 A1* | 3/2020 | Nikipelov | G03F 7/70916 |
| 2020/0101500 A1* | 4/2020 | Rotondaro | H01J 37/32541 |
| 2020/0176275 A1* | 6/2020 | Yonekawa | G03F 7/0002 |
| 2020/0348606 A1* | 11/2020 | Perez-Falcon | G03F 7/707 |
| 2021/0041795 A1* | 2/2021 | Bruls | G03F 7/70916 |

* cited by examiner

APPARATUS AND METHOD FOR REMOVING PARTICLES IN SEMICONDUCTOR MANUFACTURING

CROSS-REFERENCE TO RELATED APPLICATION

This application claims the priority benefit of U.S. provisional application Ser. No. 62/880,663, filed on Jul. 31, 2019. The entirety of the above-mentioned patent application is hereby incorporated by reference herein and made a part of this specification.

BACKGROUND

As semiconductor devices are being scaled down, the complexity of integrated circuit manufacturing is increased. The increasing trend of miniaturization of semiconductor devices requires stringent control of the cleanliness in the process chamber in which the semiconductor process is conducted. This leads to a more strict control of the impurities and/or contaminants that are allowed in the process chamber. For example, the yield of the process is drastically reduced by the presence of contaminating particles during deposition or etching of layers which may lead to the formation of voids or short-circuits resulting in performance and reliability drawbacks in semiconductor manufacturing. Although the existing technologies have been adequate for their intended purposes, they have not been satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
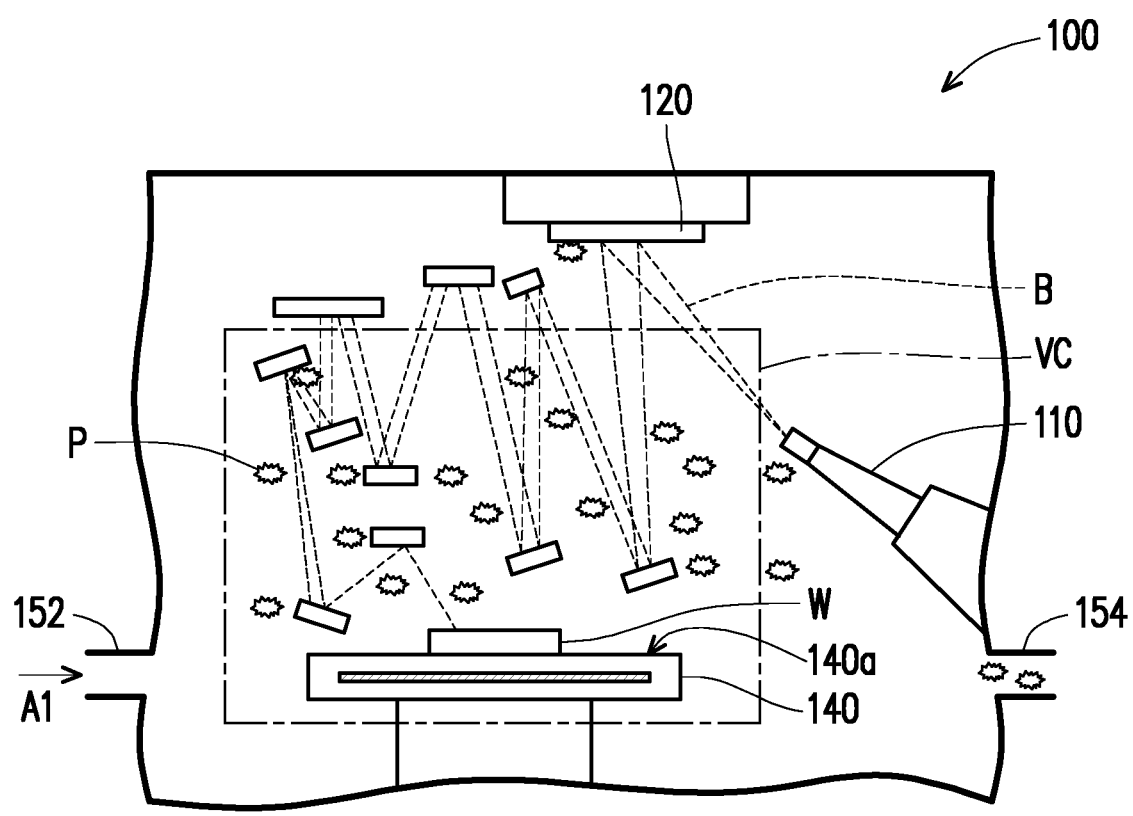
FIG. 1 is a schematic cross-sectional view illustrating a semiconductor system containing contaminating particles suspended in a process chamber according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor integrated circuit (IC) devices are used in a variety of electronic applications, such as personal computers, cell phones, digital cameras, and other electronic devices. When fabricating the IC devices, a plurality of processes (e.g., deposition, lithography, etching, grinding, and/or the like) is performed in a process chamber to form successive layers over a semiconductor substrate. It is inevitable that various particles or debris are generated inside the process chamber during the processing of semiconductor materials. As the demand for miniaturized IC devices has grown, strict control of conditions within the process chamber is important in the IC manufacturing, because even a small amount of particle contaminations may significantly reduce the yield of the IC manufacturing process. Therefore, a cleaning operation is performed to remove the particles that are generated in the process chamber.

FIG. 1 is a schematic cross-sectional view illustrating a semiconductor system containing contaminating particles suspended in a process chamber according to some embodiments of the present disclosure. Referring to FIG. 1, an example extreme ultraviolet (EUV) lithography system is illustrated to show particle contamination in a process chamber. For example, the EUV lithography system is used to fabricate the semiconductor features having small geometry sizes and may achieve higher resolution for the semiconductor features to be patterned.

The EUV lithography system 100 may include an illumination unit 110 configured to generate the radiation beams B (e.g. UV radiation, visible light radiation, or the like). In some embodiments, to achieve a required exposure dose, the illumination unit 110 is of a relatively high energy or high level of flux. For example, the radiation beams B are produced by tin plasma, such as discharge-produced plasma (DPP) or laser-produced plasma (LPP). In some embodiments, the LLP apparatus generates the radiation beams B by focusing a high-power laser beam onto small tin droplet targets to form ionized plasma that emits the radiation beams having the small wavelengths. The illumination unit 110 may include a collector to collect the beams and/or include mirrors to reflect the radiation. Other technique(s) may be employed to emit light source to achieve enhanced resolution for the semiconductor feature W to be processed.

The EUV lithography system 100 may include a reticle unit 120 disposed above the semiconductor feature W to be processed. For example, a reticle of the reticle unit 120 contains a pattern thereon. In some embodiments, the reticle is moveably carried by a reticle holder of the reticle unit 120 and faces toward the semiconductor feature W. In some embodiments, the reticle holder is operable to move the reticle to be positioned as required for accurate exposure. The EUV lithography system 100 may include a projection unit 130 configured to image the pattern of the reticle onto the semiconductor feature W to be processed. In some embodiments, the projection unit 130 includes lens, reflective mirror(s), condenser(s), or the like. It should be noted that the configuration of the projection unit 130 shown in FIG. 1 is an example and may be adjusted according to process requirements. The reticle unit 120 may be positioned over the projection unit 130. For example, during a lithographic exposure performed using the EUV lithography system 100, the radiation beam B is directed by the illumination unit 110 onto a selected region of the reticle of the reticle unit 120, and then propagated to the projection unit 130. In some embodiments, the propagation path of the radiation beams B is enclosed in a vacuum environment produced in a process chamber VC.

The EUV lithography system 100 may include a substrate holder 140 configured to hold the semiconductor feature W on a receiving surface 140*a* of the substrate holder 140. The semiconductor feature W may be a lithography target such as a semiconductor substrate or a photosensitive material formed over a semiconductor substrate. In some embodiments, the substrate holder 140 is positioned below the projection unit 130 and disposed downstream of the propagation path of the radiation beams B. For example, the radiation beam B is reflected by the projection unit 130 towards the semiconductor feature W to imprint the pattern of the reticle onto the semiconductor feature W. The substrate holder 140 may be or may include an electrostatic chuck (E-chuck) which uses an electronic force to secure the semiconductor feature W that is to be patterned. In other embodiments, the substrate holder 120 includes a chuck that uses clamps to secure the semiconductor feature W. In other embodiments, the substrate holder 120 includes a vacuum chuck that generates vacuum pressures through vacuum ports in the chuck to hold the semiconductor feature W thereon. The semiconductor feature W may be mounted by other appropriate mounting force via the substrate holder 140.

In some embodiments, the particles P enters from outside the system when exposing the process chamber VC to the atmosphere for transferring the semiconductor feature W before or after processing. In some embodiments, when performing processing in the process chamber VC, the particles P tend to be produced due to the contact friction between the semiconductor feature W and the substrate holder 140, hardware erosion, or the like. In some embodiments, the particles P introduced by a variety of methods such as during a chemical mechanical polishing process, a cleaning process, and/or during handling of the reticles. Those particles P suspended in the process chamber VC may contaminate the reticle of the reticle unit 120, the projection unit 130, the semiconductor feature W that is being processed, the substrate holder 120, and/or any component in the EUV lithography system 100 that is sensitive to particle contamination. The presence of particle contamination in the process chamber VC causes yield problems and requires cleaning of the process chamber VC. For example, particle contamination introduced to the EUV lithography system 100 results in significant degradation of the lithographically transferred pattern. Due to the detrimental impact of particles to the EUV lithography system 100, many types of cleaning methods are used.

In some embodiments, to reduce the particle contamination, a cleaning gas enters the process chamber VC as indicated by the arrow A1, and the particles P may be exhausted from the process chamber VC via the cleaning gas. For example, the EUV lithography system 100 includes a gas inlet 152 and a gas outlet 154. The gas inlet 152 may be used to flow the cleaning gas into the process chamber VC, and the gas outlet 154 may be used to evacuate the cleaning gas from the process chamber VC. The gas inlet 152 and the gas outlet 154 may be disposed at opposing sides of the process chamber VC. In other embodiments, the gas inlet 152 and the gas outlet 154 are disposed at the same side of the process chamber VC. Other configuration of the gas inlet 152 and the gas outlet 154 is possible. It should be noted that the EUV lithography system 100 shown in FIG. 1 is simplified, and some components (e.g., gas supply tank, pump, pipeline, controller, driving unit, power source, etc.) are omitted for ease of illustration.

Various cleaning techniques will be described later in other embodiments accompanying with figures. It should be noted that the EUV lithography system described herein is illustrative and should not be construed as limiting the scope of the implementations. The semiconductor process chamber for performing an etching process, a deposition process, a grinding process, etc., which is suffered from particle contamination, may benefit from the present disclosure.

Figure 2A:
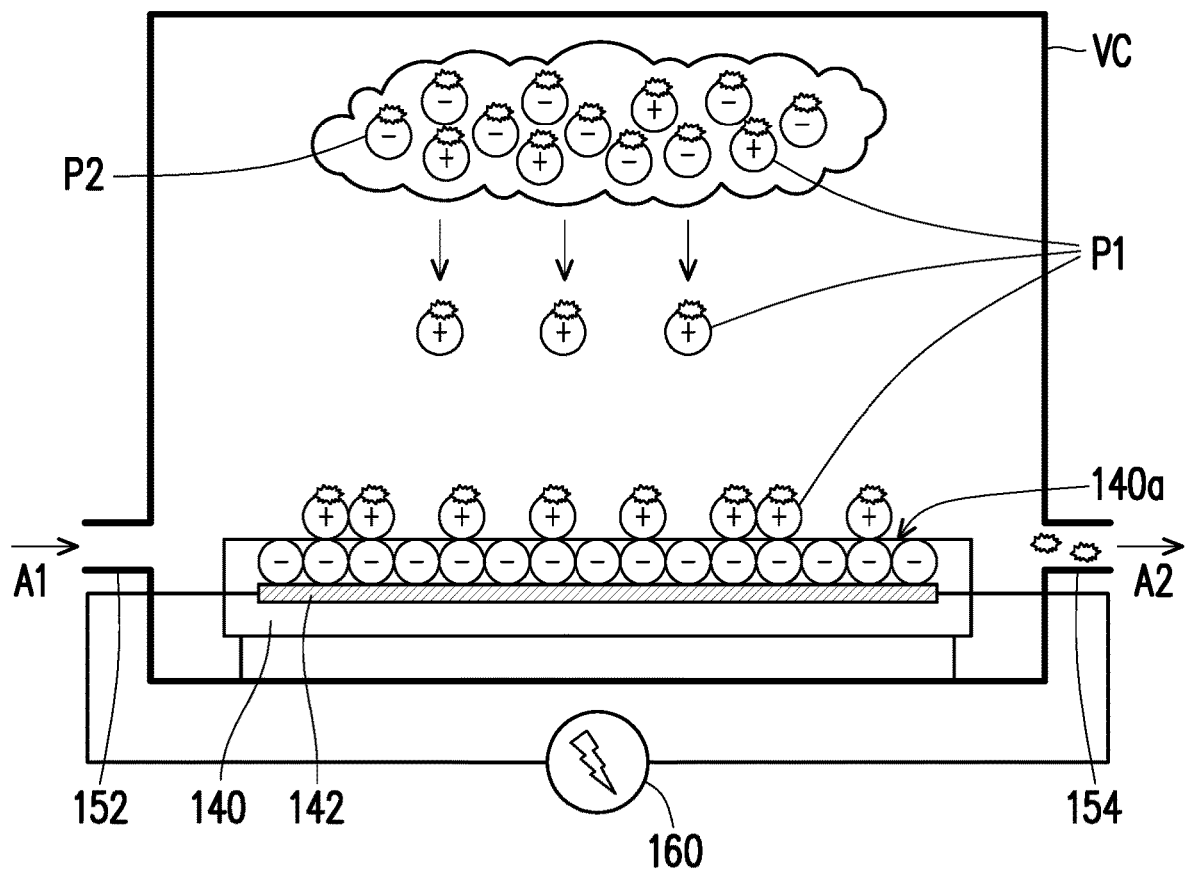
FIG. 2A and FIG. 2B are schematic cross-sectional views illustrating removing contaminating particles from a process chamber according to some embodiments of the present disclosure.
Figure 2B:
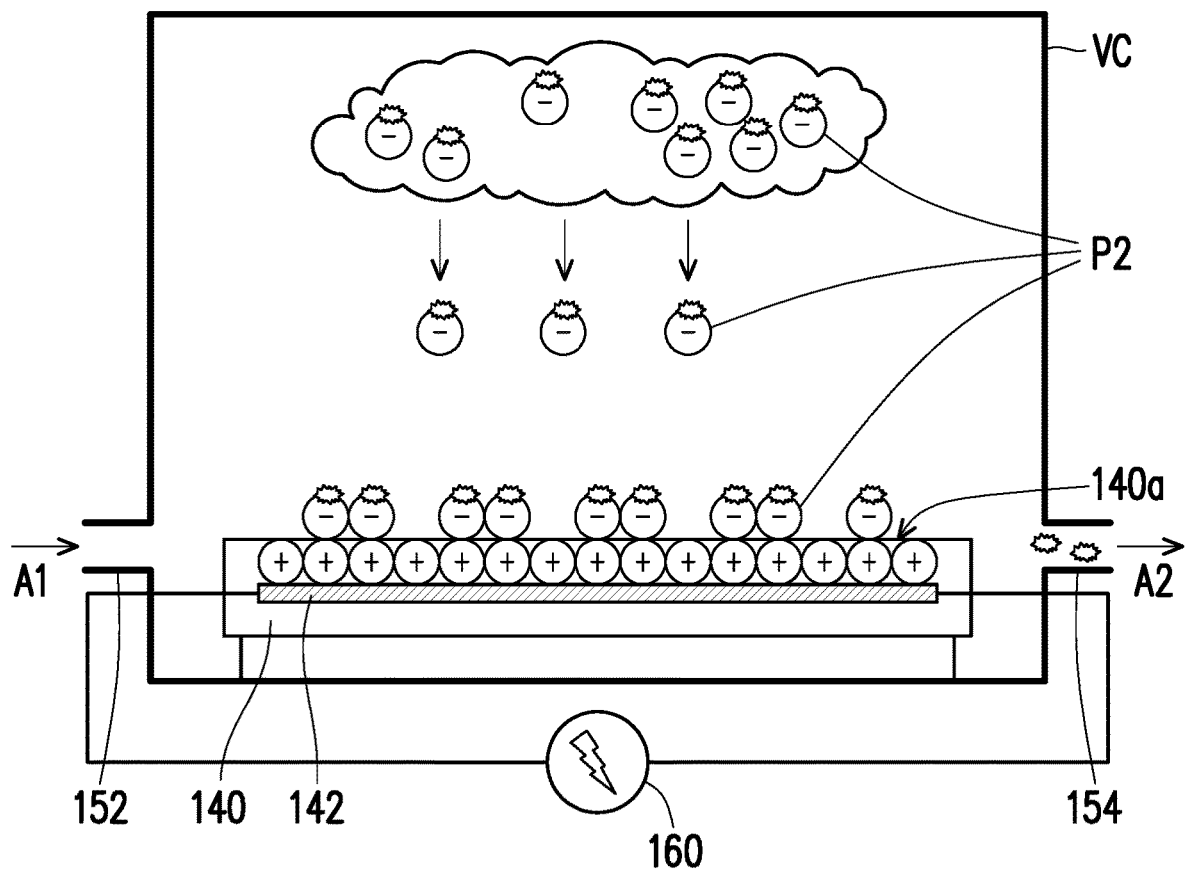

FIG. 2A and FIG. 2B are schematic cross-sectional views illustrating removing contaminating particles from a process chamber according to some embodiments of the present disclosure. It should be noted that a process chamber for performing a semiconductor process is shown in a simplified manner, and some components are omitted for ease of illustration.

Referring to FIG. 2A and FIG. 2B, the substrate holder 140 disposed inside the process chamber VC is electrically coupled to a power source 160. For example, the substrate holder 140 including the electrostatic chuck which includes a conductive electrode 142 therein. For example, the conductive electrode 142 is disposed proximal to the receiving surface 140*a*, and the receiving surface 140*a* of the substrate holder 140 is directly over and overlapping the conductive electrode 142. The power source 160 may be electrically coupled to the conductive electrode 142, and a voltage provided from the power source 160 is applied to the conductive electrode 142. In some embodiment, the power source 160 is configured to provide a direct current (DC) or alternating current (AC) power to the conductive electrode 142. In other embodiments, the power source 160 is configured to provide radio frequency (RF) power to the conductive electrode 142. For example, when a high voltage (e.g., about 1600V) is applied to the conductive electrode 142, the conductive electrode 142 may be charged with positive charges (marked using "+" marks throughout the figures) or negative charges (marked using "-" marks throughout the figures). It is appreciated that the voltage applied to the conductive electrode 142 may vary depending on process requirements. The positive charges or negative charges generated from the conductive electrode 142 provide an electrostatic force to attract suspended particles (P1 and P2) to move toward the receiving surface 140a of the substrate holder 140. It should be noted that the particle cloud shown herein is an illustrative example and suspended particles as small as 10 μm in diameter and below may be distributed everywhere in the process chamber VC.

For example, after transferring the processed semiconductor feature out of the process chamber VC or before transferring the semiconductor feature to be processed into the process chamber VC, a cleaning operation is performed in the process chamber VC to remove contaminating particles (e.g., P1 and P2) from the process chamber VC. In some embodiments, the cleaning operation is performed in a vacuum environment. In some embodiments, during the process of removing particles (e.g., P1), the conductive electrode 142 is charged with negative charges, and the negative charges from the conductive electrode 142 may migrate to accumulate close to the receiving surface 140a of the substrate holder 140, and hence the particles P1 having the positive polarity in the process chamber VC are attracted to the receiving surface 140a of the substrate holder 140. The voltage is applied to the conductive electrode 142 for a time sufficient to cause the particles (e.g., P1 and P2) to attach to the receiving surface 140a of the substrate holder 140. The time period duration of operation may vary from seconds to a few minutes, which depends on the process requirements. For example, a controller (not shown; e.g., a part of a computing device) coupled to the power source 160 is operative to selectively connect or disconnect the power source 160 from the conductive electrode 142. The controller may be controlled by a processor (not shown; e.g., a part of a computing device) and may carry out aspects of the various processes discussed herein. In some embodiments, the controller is operative to reverse the polarity of the voltage supplied by the power source. The process of removing the particles (e.g., P1 and P2) may be controlled by a time mode or other suitable methods. For example, after a period of time, changing the polarity of the conductive electrode 142 from negative to positive.

In some embodiments, the cleaning gas is flown through the process chamber VC in a direction indicated by arrows A1 and A2. Introduction of the cleaning gas via the gas inlet 152 for bringing the particles (e.g., P1 and P2) away from the receiving surface 140a of the substrate holder 140 and exhausting from the gas outlet 154 facilitates removing the particles (e.g., P1 and P2) from the process chamber VC. For example, the cleaning gas includes an inert gas, oxygen, mixture of these, and/or other suitable fluid. In some embodiments, when the conductive electrode 142 is charged or after disconnecting the conductive electrode 142 from the power source 160, the cleaning gas may be flown through which the particles (e.g., P1 and P2) attached to the receiving surface 140a of the substrate holder 140 are removed from the process chamber VC. In some embodiments, the particles (e.g., P1 and P2) with a size from about 0.1 μm to about 10 μm in the process chamber VC are removed. In some embodiments, the action of changing the polarity of the receiving surface 140a of the substrate holder 140 from negative to positive and the action of providing the gas flow are performed during the same step.

In some embodiments, a switch (not shown) is opened and the polarity of the voltage supplied by the power source 160 is reversed, thereby applying positive charges to the conductive electrode 142. For removing the particles (e.g., P2) having negative polarity, positive charges may be accumulated on the receiving surface 140a of the substrate holder 140 to attract the particles (e.g., P2) having negative polarity to the receiving surface 140a of the substrate holder 140, as shown in FIG. 2B. In some embodiments, after a period of time, a certain amount of the particles (e.g., P2) are accumulated on the receiving surface 140a of the substrate holder 140, and then those particles (e.g., P2) on the receiving surface 140a are purged via the gas flow provided from the gas inlet 152 and exhausted through the gas outlet 154 from the process chamber VC. In some embodiments, when changing the polarity of the conductive electrode 142 from negative to positive, the particles attached on the receiving surface 140a of the substrate holder 140 may be released, during that time, the gas flow is supplied to bring the particles away from the receiving surface 140a of the substrate holder 140. In some embodiments, the action of providing the gas flow through the process chamber VC may be performed during the action of attracting the particles to the receiving surface 140a of the substrate holder 140. In some embodiments, when the power source 160 is switched off which leads to the sudden loss of energy in the particles, the action of providing the gas flow through the process chamber VC is performed to exhaust the cleaning gas along with the particles.

The aforementioned steps may be performed multiple times to establish a clean environment for semiconductor manufacturing processes. For example, the in-situ cleaning operation is automatically performed after processing the semiconductor feature W (shown in FIG. 1) is complete or after processing one or more wafer lots. The lot of wafers may include wafers associated with the same product type and that are processed at substantially the same time. In other embodiments, the cleaning operation is manually performed. While the operation method is illustrated in FIG. 2A and FIG. 2B as a series of acts or events, it will be appreciated that the illustrated ordering of such acts or events are not to be interpreted in a limiting sense. In other embodiments, the conductive electrode 142 is charged with positive charges to attract the particles P2 having the negative polarity to the receiving surface 140a of the substrate holder 140, and then the polarity of the conductive electrode 142 is switched to accumulate the negative charges on the receiving surface 140a so as to attract the particles P1 having the positive polarity to the receiving surface 140a of the substrate holder 140. The action of changing the polarity of the receiving surface 140a of the substrate holder 140 from negative to positive and the action of providing the gas flow may be sequentially or simultaneously performed. It should be understood that additional operation(s) may be provided before, during, and after the operating method illustrated in FIG. 2A and FIG. 2B, certain operation(s) may be performed concurrently with other operations, and certain operation(s) may be omitted.

Figure 3A:
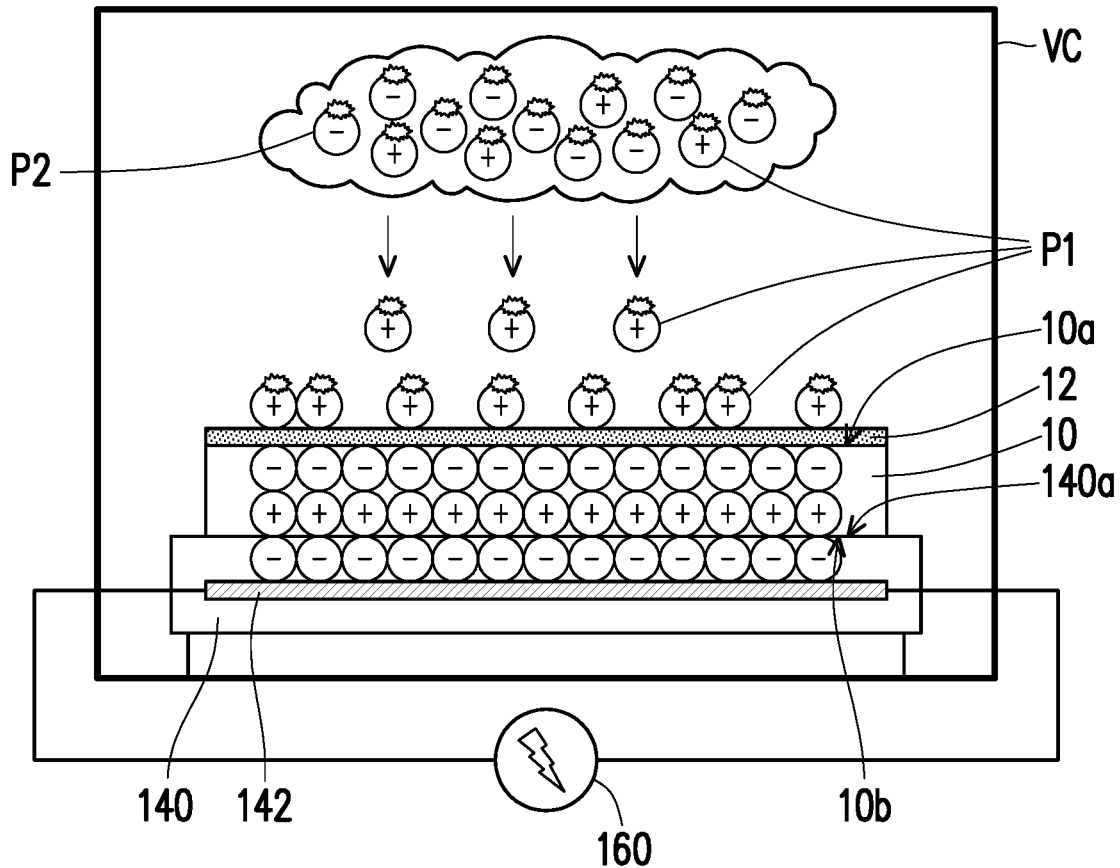
FIG. 3A to FIG. 3C are schematic cross-sectional views illustrating various stages of removing contaminating particles from a process chamber according to some embodiments of the present disclosure.
Figure 3B:
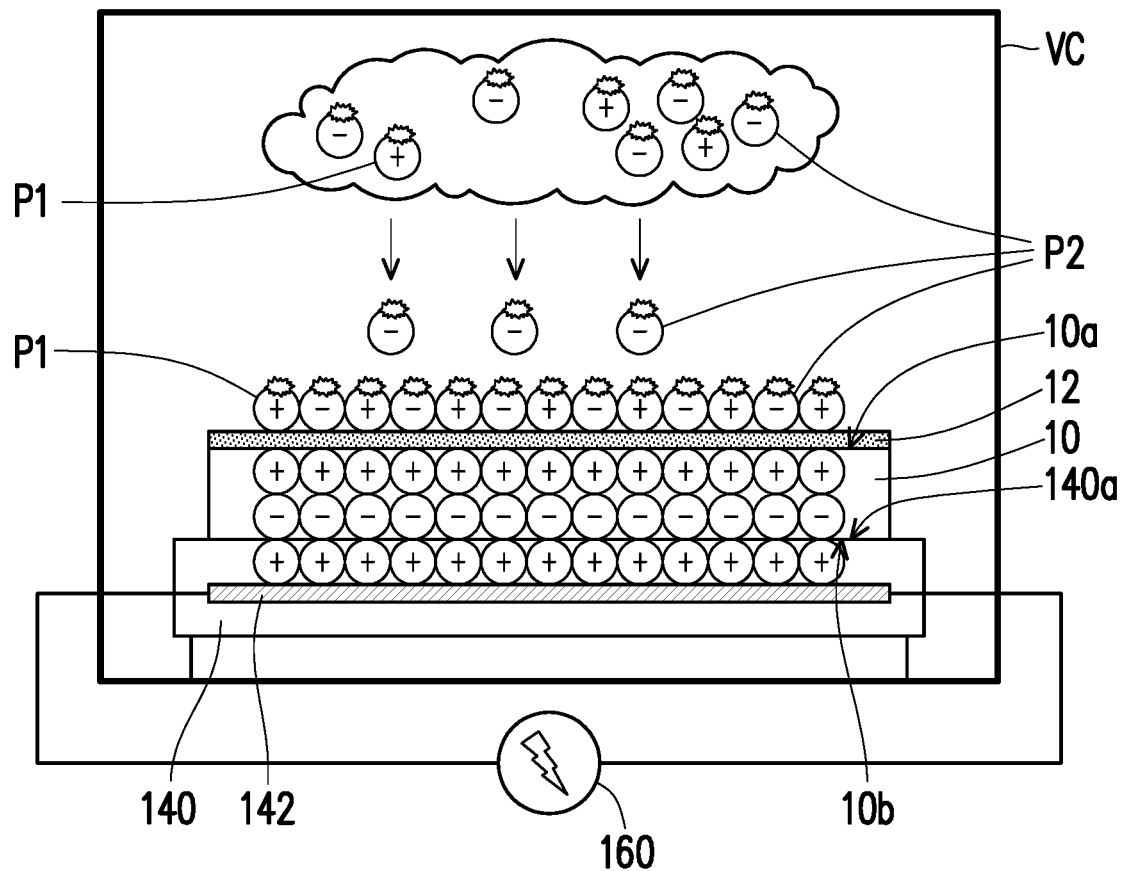
Figure 3C:
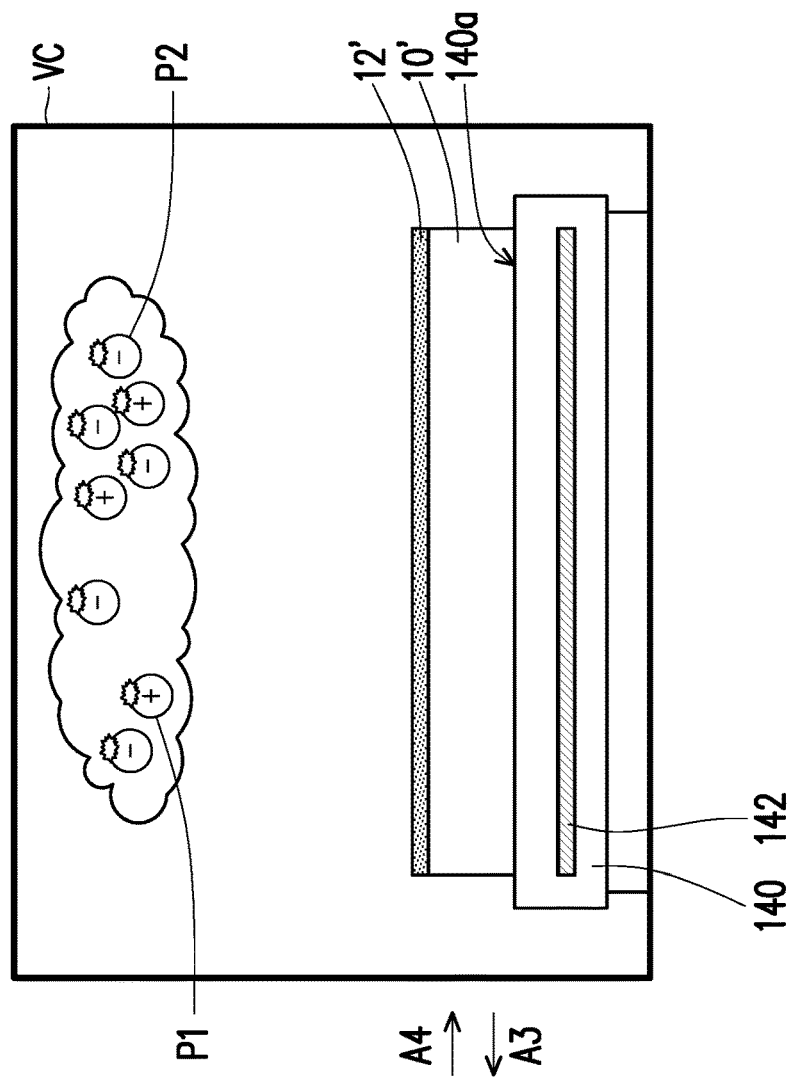
Figure 3C:
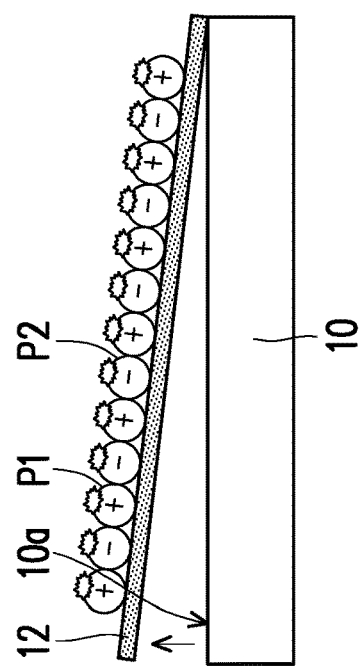
Figure 4:
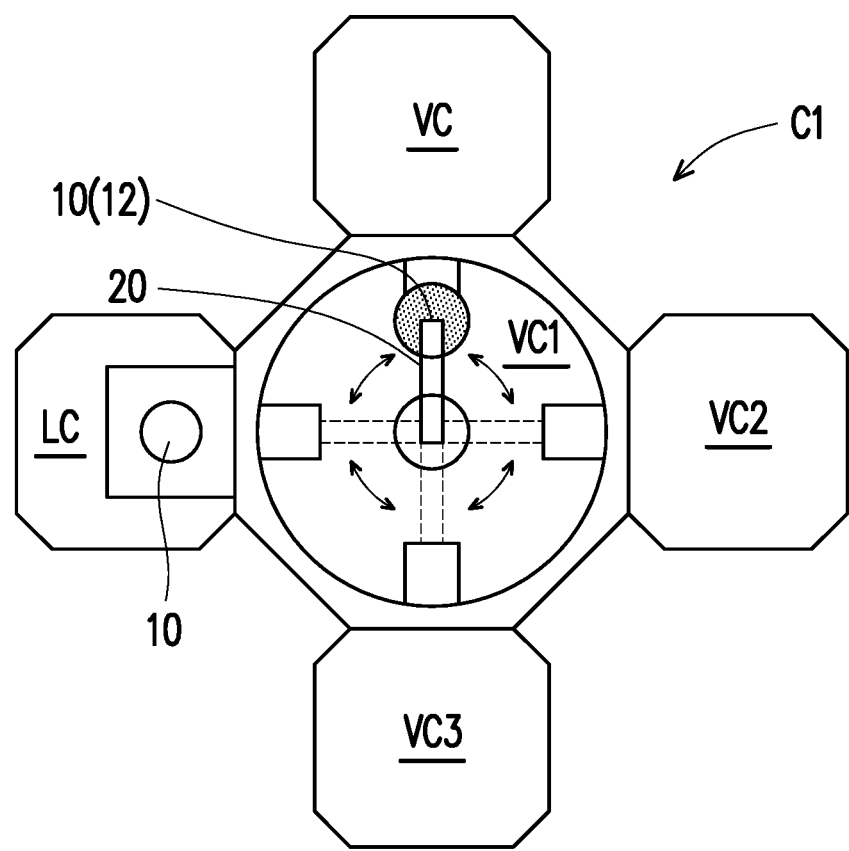
FIG. 4 is a schematic top view illustrating handling of substrates between various chambers according to some embodiments of the present disclosure.

FIG. 3A to FIG. 3C are schematic cross-sectional views illustrating various stages of removing contaminating particles from a process chamber according to some embodiments of the present disclosure and FIG. 4 is a schematic top view illustrating handling of substrates between various chambers according to some embodiments of the present disclosure. Like elements are designated with the same reference numbers for ease of understanding and the details thereof are not repeated herein. It should be noted that a process chamber for performing a semiconductor process is shown in a simplified manner, and some components are omitted for ease of illustration.

Referring to FIG. 3A, a substrate 10 with an adhesive layer 12 is disposed on the substrate holder 140. For example, the substrate 10 has a top surface 10a and a bottom surface 10b opposite to each other, where the bottom surface 10b faces the receiving surface 140a of the substrate holder 140, and the adhesive layer 12 is formed on the top surface 10a of the substrate 10. The substrate 10 may be made of glass, silicon, ceramic, metal, stainless steel, plastic, resin, a composite material, tape, film, or other suitable supporting materials. In some embodiments, the adhesive layer 12 is a polymer adhesive layer. For example, the adhesive layer 12 is a light-to-heat conversion (LTHC) film which reduces or loses its adhesiveness when exposed to a radiation source (e.g., ultra-violet light, or a laser). Other suitable adhesive layers, such as die attaching film (DAF) or a polymer layer including adhesive materials, may also be used. In some embodiments, the substrate 10 with the adhesive layer 12 is a dummy wafer coated with an adhesive. For example, the substrate 10 with the adhesive layer 12 is prepared in another process chamber, and then transferred to the process chamber VC for performing the particle-removing process.

In some embodiments, the substrate holder 140 uses the attraction of opposite charges on the substrate holder 140 and on the substrate 10 to attach the bottom surface 10b of the substrate 10 to the receiving surface 140a of the substrate holder 140. In some embodiments, when the voltage is applied to the substrate holder 140 from the power source 160, a force is generated between the substrate 10 and the substrate holder 140 which holds the substrate 10 on the substrate holder 140. For example, a controller (not shown) turns on the power source 160 resulting in the application of the voltage to the substrate holder 140. In some embodiments, when the high voltage is applied, the conductive electrode 142 of the substrate holder 140 is negatively charged. The negative charges may migrate and may be accumulated to the receiving surface 140a of the substrate holder 140 via the conductive electrode 142 that is negatively charged. In such embodiments, the substrate 10 disposed on the receiving surface 140a of the substrate holder 140 may have positive charges attracted to be accumulated on the bottom surface 10b and the negative charges repelled to be accumulated on the top surface 10a. When the negative charges are accumulated on the top surface 10a of the substrate 10, the particles (e.g., P1) having positive polarity that are buoyant in the process chamber VC may be attracted toward the substrate 10 so as to be attached to the adhesive layer 12. In some embodiments, particles with a size from about 0.1 µm to about 10 µm in the process chamber VC are fallen and attached to the adhesive layer 12.

Referring to FIG. 3B, for removing the particles (e.g., P2) having the negative polarity, the polarity of the receiving surface 140a of the substrate holder 140 may be reversed from negative to positive. For example, when the voltage provided from the power source 160 is applied to the substrate holder 140 to have the conductive electrode 142 positively charged, positive charges and negative charges are respectively accumulated on the facing surfaces of the substrate holder 140 and the substrate 10, respectively, so that the substrate 10 is held on the receiving surface 140a by the force acting therebetween. The negative charges in the substrate may be attracted to be accumulated on the bottom surface 10b, and the positive charges in the substrate 10 may be repelled and accumulated on the top surface 10a of the substrate 10. The particles (e.g., P2) having the negative polarity suspended in the process chamber VC may be attracted by the positive charges accumulated on the top surface 10a of the substrate 10, and then adhered to the adhesive layer 12 formed on the top surface 10a of the substrate 10.

A reversed point of changing the polarity of the conductive electrode 142 of the substrate holder 140 from negative to positive may be controlled by a time mode. Alternatively, the reversed point of changing the polarity of the conductive electrode 142 is manually controlled. In some embodiments, the cleaning operation is performed in a vacuum environment. For example, the substrate 10 with the adhesive layer 12 formed thereon is placed on the receiving surface 140a of the substrate holder 140, and then the process chamber VC is evacuated. Next, the high voltage provided by the power source 160 is applied to the conductive electrode 142 of the substrate holder 140 to perform the cleaning operation. The polarity of the conductive electrode 142 may be changed periodically. After the cleaning operation is complete, the power source 160 may be turned off, and the substrate 10 with the adhesive layer 12 having adhering particles is removed from the process chamber VC. With the cleaning operation, the number of particles (P1 and P2) suspended in the processed chamber VC may be reduced to an acceptable degree.

While the operation method is illustrated in FIG. 3A and FIG. 3B as a series of acts or events, it is appreciated that the illustrated ordering of such acts or events are not to be interpreted in a limiting sense. In other embodiments, the conductive electrode 142 is charged with the positive charges to attract the particles P2 having the negative polarity to be attached to the adhesive layer 12 on the substrate 10, and then the polarity of the conductive electrode 142 is changed to be negatively charged so as to attract the remaining particles P1 having the positive polarity to be attached to the adhesive layer 12 on the substrate 10. It should be understood that additional operation(s) may be provided before, during, and after the operating method illustrated in FIG. 3A and FIG. 3B, certain operation(s) may be performed concurrently with other operations, and certain operation(s) may be omitted.

In some embodiments, the aforementioned steps are performed multiple times to clean the process chamber VC to an acceptable degree. For example, after processing the semiconductor feature W (shown in FIG. 1) is complete or after processing one or more wafer lots, the substrate 10 with the adhesive layer 12 formed thereon is transferred into the process chamber VC for performing the in-situ cleaning operation. In some embodiments, after several runs of changing the polarity of the conductive electrode 142 or after a period of time, a certain amount of particles (P1 and P2) are collected by the adhesive layer 12, and then the substrate 10 with the adhesive layer 12 having particles (P1 and P2) may be removed from the process chamber VC.

Referring to FIG. 3C and FIG. 4, if the process chamber VC is not clean enough to reach the acceptable degree or not enough to perform the semiconductor process on the semiconductor feature W (shown in FIG. 1), the substrate 10 with the adhesive layer 12 having particles (P1 and P2) may be replaced with another one. For example, the substrate 10 having the adhesive layer 12 with attached particles (P1 and P2) is moved out of the process chamber VC as indicated by the arrow A3, and then another substrate 10' having an adhesive layer 12' formed thereon may be delivered to the process chamber VC as indicated by the arrow A4. The substrate 10' with adhesive layer 12' is then disposed on the substrate holder 140 for performing another round of particle removal. The steps described above may be repeatedly performed to remove the remaining particles (e.g., P1 and P2) in the process chamber VC to the acceptable degree. The replacement of the substrate 10 may be performed before or after changing the polarity of the conductive electrode 142.

In some embodiments, the process chamber VC is a part of a multi-chamber system C1. For example, the multi-chamber system C1 includes a plurality of chambers and a robotic arm 20 configured to transfer the substrate 10 between the chambers. In some embodiments, the substrate 10 or a cassette of substrate is introduced into a load lock chamber LC, and then transferred to a buffer chamber VC1 by the robotic arm 20, and the robotic arm 20 may deliver the substrate 10 to a deposition chamber VC2. For example, the step of forming the adhesive layer 12 on the substrate 10 is performed in the deposition chamber VC2. The robotic arm 20 may transfer the substrate 10 with the adhesive layer 12 to the process chamber VC for removing the particles in the process chamber VC. After performing the cleaning operation, the substrate 10 having the adhesive layer 12 with adhering particles may be transported out of the process chamber VC.

In some embodiments, the substrate 10 delivered out of the process chamber VC may be reused. For example, the substrate 10 having the adhesive layer 12 with adhering particles (P1 and P2) is delivered to an etch chamber VC3. The step of removing the adhesive layer 12 with adhering particles from the substrate 10 may be performed in the etch chamber VC3. In some embodiments in which the adhesive layer 12 is a LTHC film, the ultra-violet (UV) light or a laser may be shined onto the adhesive layer 12 to remove the adhesive layer 12 from the substrate 10. Other techniques (e.g., etching, mechanical peeling, or the like) may be employed to remove the adhesive layer 12 from the top surface 10a of the substrate 10. After removing the adhesive layer 12, the substrate 10 may be transported to the deposition chamber VC2 in which another adhesive layer is formed on the substrate 10, and then the substrate 10 with the another adhesive layer is transferred to the process chamber VC for performing another round of cleaning operation. In some embodiments, the buffer chamber VC1 is surrounded by the manufacturing chambers such as the process chamber VC, the deposition chamber VC2, the etch chamber VC3, and the load lock chamber LC. It is noted that the number and the configuration of chambers shown in FIG. 4 are an example, and other number and the configuration of chambers are within the scope of this disclosure. Likewise, in some embodiments, more than one robot arm are included in the multi-chamber system C1.

Figure 5:
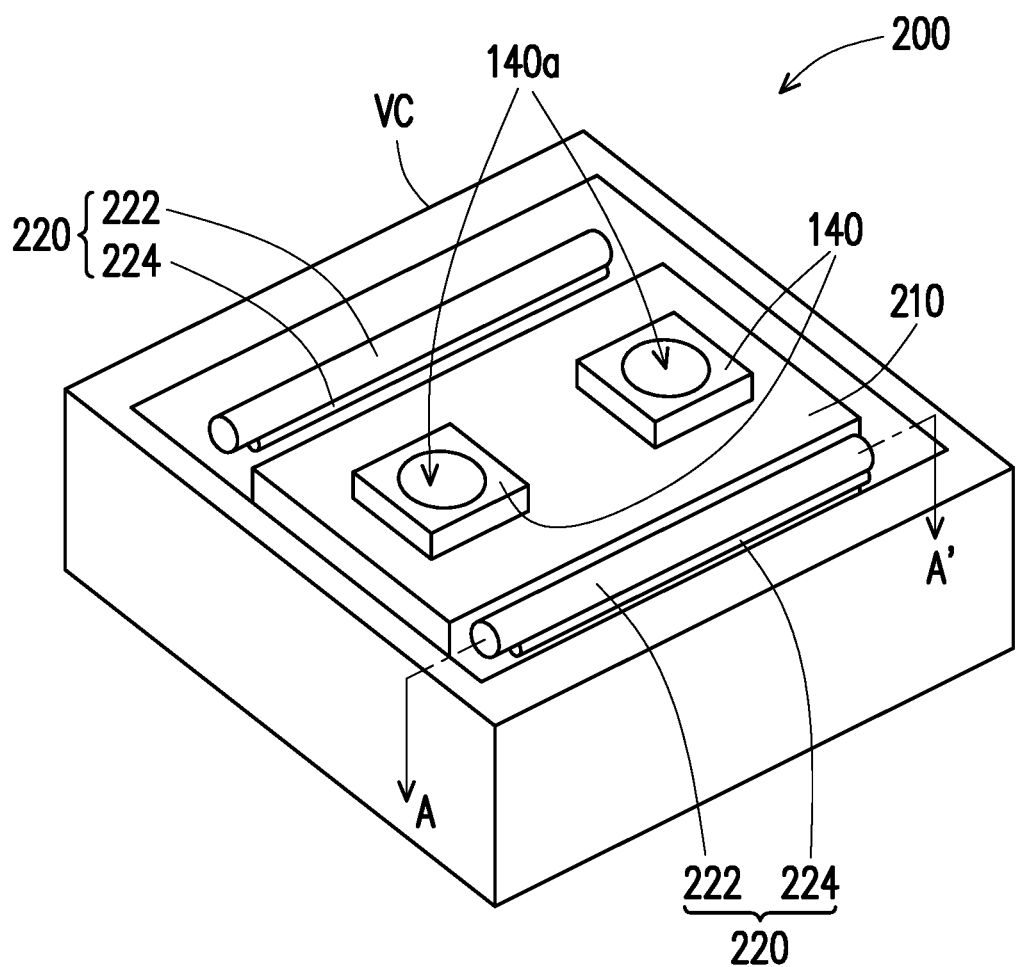
FIG. 5 is a schematic perspective view illustrating an apparatus for removing contaminating particles in a process chamber according to some embodiments of the present disclosure.
Figure 6A:
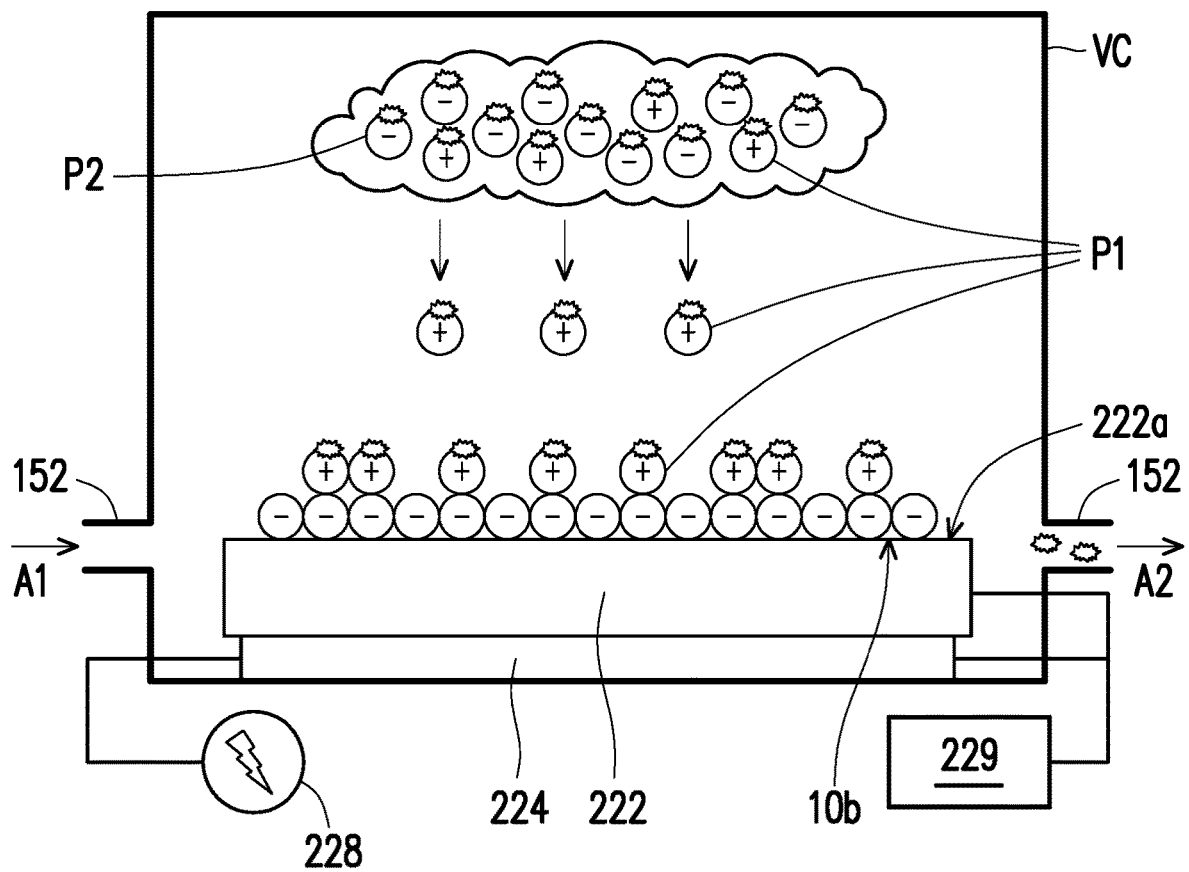
FIG. 6A is a schematic cross-sectional view taken along line A-A' in FIG. 5 and illustrating a method of removing contaminating particles from a process chamber according to some embodiments of the present disclosure.
Figure 6B:
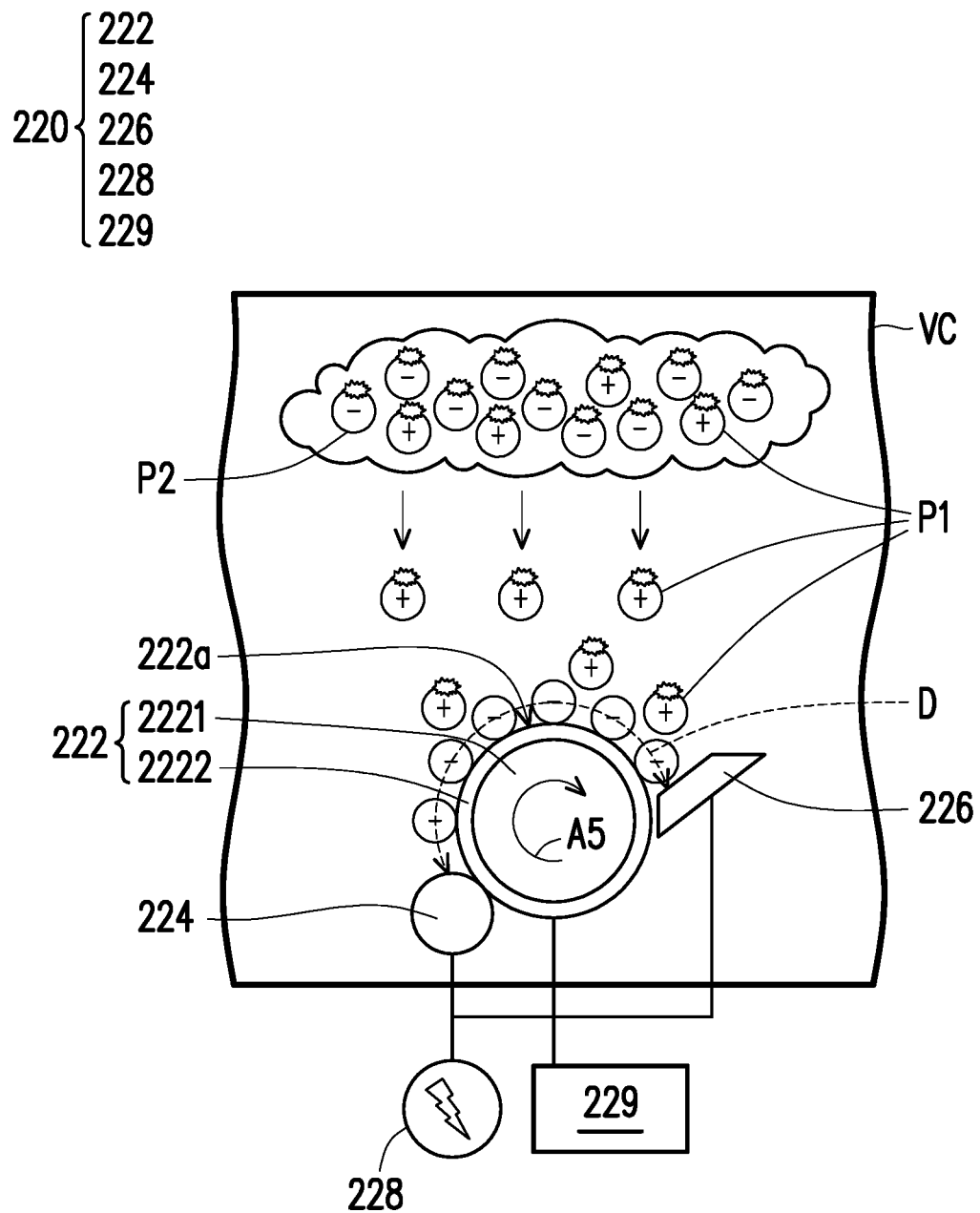
FIG. 6B is a schematic side view of FIG. 6A according to some embodiments of the present disclosure.
Figure 7A:
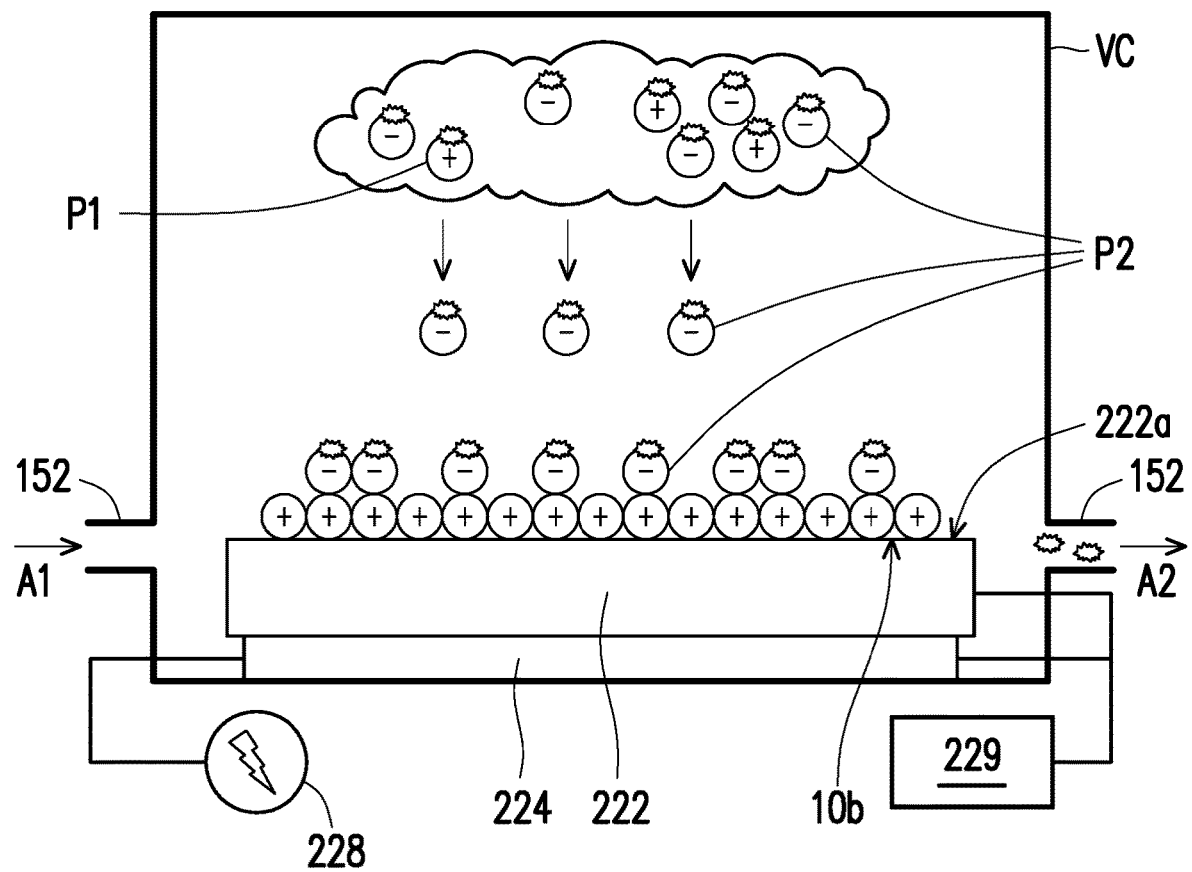
FIG. 7A is a schematic cross-sectional view taken along line A-A' in FIG. 5 and illustrating a method of removing contaminating particles from a process chamber according to some embodiments of the present disclosure.
Figure 7B:
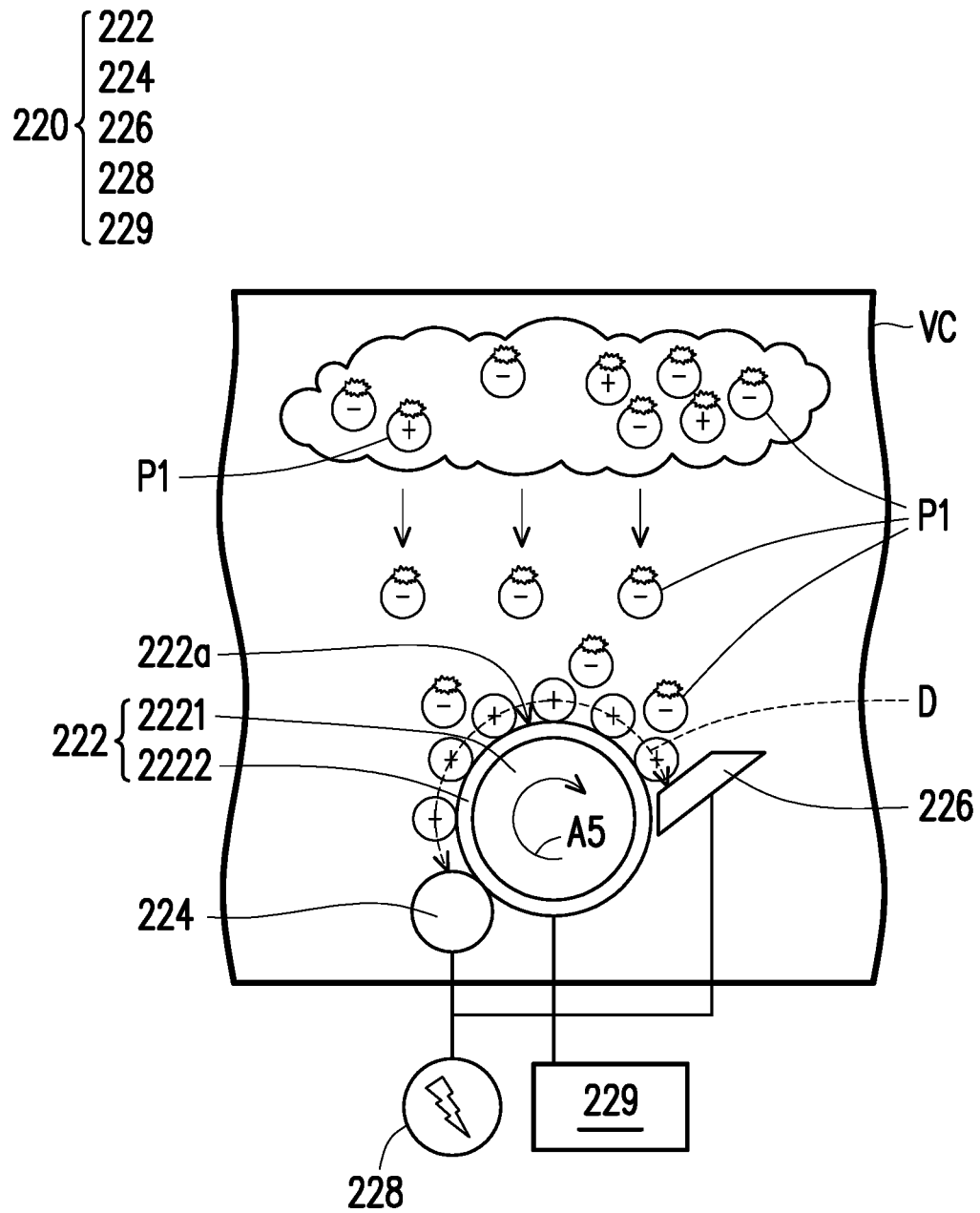
FIG. 7B is a schematic side view of FIG. 6A according to some embodiments of the present disclosure.

FIG. 5 is a schematic perspective view illustrating an apparatus for removing contaminating particles in a process chamber according to some embodiments of the present disclosure, FIG. 6A and FIG. 7A are schematic cross-sectional views taken along line A-A' in FIG. 5 and illustrating a method of removing contaminating particles from a process chamber according to some embodiments of the present disclosure, where some components configured in the process chamber are omitted in FIG. 6A and FIG. 7A. FIG. 6B and FIG. 7B are schematic side views of FIG. 6A and FIG. 7A, respectively, according to some embodiments of the present disclosure. Like elements are designated with the same reference numbers for ease of understanding and the details thereof are not repeated herein. It should be noted that a process chamber for performing a semiconductor process is shown in a simplified manner, and some components are omitted for ease of illustration.

Referring to FIG. 5, a semiconductor system 200 includes the process chamber VC inside which a semiconductor process (e.g., lithography, etching, grinding, etc.) is performed. In some embodiments, the semiconductor system 200 includes a platform 210 for holding the semiconductor feature to be processed in the process chamber VC. The platform 210 may be a wafer stage or include the substrate holder 140 as a part thereof. In some embodiments, the platform 210 is operable to secure and move the semiconductor feature to be processed. For example, the substrate holder 140 of the platform 210 secures the semiconductor feature to be processed by such as an electrostatic device, a vacuum device, or a mechanical clamping device. For example, the platform 210 is capable of translational and/or rotational displacement for wafer alignment, stepping, and scanning. The platform 210 may include various components (not shown) suitable to secure the semiconductor feature and perform precise movement. In some embodiments, a cleaning apparatus 220 is disposed aside the platform 210 and configured to remove suspended particles from the process chamber VC.

Referring to FIG. 5, FIG. 6A, and FIG. 6B, in some embodiments, the cleaning apparatus 220 includes a particle-attaching member 222 configured to move in a moving direction A5, a charging member 224 disposed on an upstream side of the particle-attaching member 222 in the moving direction A5, and a cleaning member 226 disposed on a downstream side of the particle-attaching member 222 in the moving direction A5. A power source 228 of the cleaning apparatus 220 may be at least electrically coupled to the charging member 224 for applying a voltage to the charging member 224. In some embodiments, the particle-attaching member 222 is disposed next to the platform 210, and may be located below the receiving surface 140a of the substrate holder 140 relative to the ground. Alternatively, the particle-attaching member 222 is disposed parallel to the platform 210, and may be located above the receiving surface 140a of the substrate holder 140, relative to the ground. The relative position of the particle-attaching member 222 and the platform 210 may vary depending on the apparatus requirements. The cleaning apparatus 220 may include a controller 229 that receives signals from a host device (not shown) and operates various members (e.g., the particle-attaching member 222, the charging member 224, the cleaning member 226, etc.) of the cleaning apparatus 220. For example, the controller 229 is configured to control a motion of the particle-attaching member 222 and control the polarity of the electrical charges to be accumulated on the particle-attaching member 222. In some embodiments, the controller 229 is configured to control a charge voltage to be applied to the charging member 224.

In some embodiments, the particle-attaching member 222 is a column-shaped member, and the axis (e.g., rotation center) of the particle-attaching member 222 is substantially parallel to a side of the platform 210. In some embodiments, the particle-attaching member 222 includes an inner portion 2221 and an outer portion 2222 wrapping the inner portion 2221. For example, the inner portion 2221 is a neutral core including superconducting material which may carry electricity with no resistance, or other suitable conductive materials. In some embodiments, the inner portion 2221 is an aluminum drum-shaped base. The outer portion 2222 of the particle-attaching member 222 is an insulating overcoat layer on the inner portion 2221. The outer portion 2222 may include polymeric material, rubber, resin, or other suitable material for improving abrasion wear resistance of the inner portion 2221. The outer portion 2222 serving as a robust overcoat layer may protect the inner portion 2221 from damage and extend a useful life of the inner portion 2221.

In some embodiments, the particle-attaching member 222 is rotationally driven in the direction as indicated by the arrow A5 (e.g., clockwise) with a driving device (e.g., shafts, gears, motors, or the like; not shown). It should be noted that the rotation direction A5 illustrate in FIG. 6B is an example, and the particle-attaching member may be configured to rotate in an anti-clockwise direction.

In some embodiments, the charging member 224 is a roller-shaped member, and the axis of the charging member 224 is parallel to the axis of the particle-attaching member 222. For example, the charging member 224 is disposed aside and below the particle-attaching member 222. The axis of the particle-attaching member 222 may be higher than the axis of the charging member 224, relative to the ground. Alternatively, the charging member 224 takes other forms and shapes (e.g., brush-shaped, tabular shape, belt-shaped etc.) as long as the charging member 224 follows the outer surface 222a of the particle-attaching member 222 and charges the particle-attaching member 222. In some embodiments, the charging member 224 is in physical contact with the outer surface 222a of the particle-attaching member 222 and may be configured to rotate in a direction opposite to the rotation of the particle-attaching member 222. Alternatively, the charging member 224 and the particle-attaching member 222 are configured to rotate in the same direction. In other embodiments, the charging member 224 is arranged close to the outer circumference surface of the particle-attaching member 222.

The power source 228 serving as the high-voltage supplying member may be electrically connected to the charging member 224 and apply a voltage to the charging member 224. For example, when a high voltage is applied to the charging member 224, the charging member 224 is charged with positive charges or negative charges. In some embodiments, the charging member 224 rubs against the outer surface 222a of the particle-attaching member 222 and uniformly charges the outer surface 222a of the particle-attaching member 222, so that positive charges or negative charges may be accumulated on the outer surface 222a of the particle-attaching member 222a. By means of the particle-attaching member 222a that is charged to have a polarity, particles suspended having an opposing polarity in the process chamber VC may be attracted to the particle-attaching member 222.

In some embodiments, the cleaning member 226 and the charging member 224 are disposed along the circumference of the particle-attaching member 222 and spaced apart by a distance D. During the cleaning operation, the suspended particles (e.g., P1 and P2) in the process chamber VC may be attracted to fall in the region of the outer surface 222a of the particle-attaching member 222 defined by the distance D between the cleaning member 226 and the charging member 224. The cleaning member 226 may be in physical contact with the outer portion 2222 of the particle-attaching member 222, so that as the particle-attaching member 222 rotates, the cleaning member 226 may remove the attached particles from the outer surface 222a of the particle-attaching member 222.

For example, the cleaning member 226 is a blade, a scrubber, a brush, or other suitable means that is capable of removing the particles attached to the outer surface 222a of the particle-attaching member 222. In some embodiments, the cleaning member 226 is a tabular member formed of an elastic body, which may scrape off particles on the particle-attaching member 222 without damaging the particle-attaching member 222. The cleaning member 226 may take various forms and shapes which is not limited in the disclosure. In some embodiments, a pair of the cleaning apparatus 220 is disposed at two opposing sides of the platform 210. In other embodiments, a single set of the cleaning apparatus 220 is disposed in the process chamber VC. The number and the configuration of the cleaning apparatus 220 may be adjusted depending on the process requirements and construe no limitation in the disclosure.

With reference to FIG. 6A and FIG. 6B, in some embodiments, during the cleaning operation, the voltage supplied by the power source 228 is applied to the charging member 224, so that the charging member 224 is negatively charged. As the particle-attaching member 222 rotates in the direction A5, the portion of the outer surface 222a of the particle-attaching member 222 that had been in contact with the charging member 224 may have the negative charges accumulated thereon. In some embodiments, the negative charges are distributed on the outer surface 222a of the particle-attaching member 222 in a substantially uniformly manner. The particles (e.g., P1) having the positive polarity that are buoyant in the process chamber VC may be attracted by the negative charges accumulated on the portion of the outer surface 222a of the particle-attaching member 222, and then the particles (e.g., P1) having the positive polarity may be attached to the portion of the outer surface 222a of the particle-attaching member 222 that has the negative charges accumulated thereon. In some embodiments, the particles with a size from about 0.1 µm to about 10 µm in the process chamber VC are attracted to and fallen on the particle-attaching member 222. When the particle-attaching member 222 continues to rotate and the portion of the outer surface 222a of the particle-attaching member 222 passes the cleaning member 226, the negative charges on the portion of the outer surface 222a and the particles (e.g., P1) having the positive polarity attracted thereto may be removed by the cleaning member 226. The cleaning gas is optionally flown through the process chamber VC in the directions indicated by the arrows A1 and A2 to facilitate exhausting the particles (e.g., P1) from the process chamber VC.

With reference to FIG. 7A and FIG. 7B, to remove particles (e.g., P2) having the negative polarity in the process chamber VC, the particle-attaching member 222 may be charged to have the positive polarity. For example, after a period of time, the polarity of the charging member 224 is changed from negative to positive. A reversed point of changing the polarity of the charging member 224 may be controlled automatically (e.g., by a time mode) or may be manually controlled. In some embodiments, a switch (not shown) is opened and the polarity of the voltage supplied by the power source 228 is reversed, thereby applying the positive charges to the charging member 224. When the outer surface 222a passes through the charging member 224, the outer surface 222a of the particle-attaching member 222 is charged to have the positive polarity. In some embodiments, the positive charges are distributed on the outer surface 222a of the particle-attaching member 222 in a substantially uniformly manner. Subsequently, the particles (e.g., P2) having the negative polarity that are suspended in the process chamber VC may be attracted by the positive charges on the outer surface 222a of the particle-attaching member 222 and settled thereon. Those particles (e.g., P2) having the negative polarity may be removed by the cleaning member 226 along with the positive charges that the particles (e.g., P2) are attracted to. In some embodiments, the cleaning gas is provided each time before changing the polarity of the charging member 224 to purge away the particles from the process chamber VC. In other embodiments, the cleaning gas is provided after collecting the particles having the negative polarity and the particles having the positive polarity. Alternatively, the step of providing the cleaning gas is omitted, and the particles removed by the cleaning member 226 are collected to a particle container (not shown). With the cleaning operation, the number of particles (P1 and P2) suspended in the processed chamber VC may be reduced to an acceptable degree.

According to some embodiments, a method for removing particles from a semiconductor process chamber including at least the following steps is provided. Electrical charges having a first polarity are accumulated on a receiving surface of the substrate holder by applying a voltage to the substrate holder. The particles having a second polarity in the semiconductor process chamber are attracted to move toward the receiving surface of the substrate holder on which the electrical charges having the first polarity are accumulated, where the first polarity is opposite to the second polarity. The particles having the second polarity are removed from the semiconductor process chamber.

According to some alternative embodiments, a method for removing particles from a semiconductor process chamber including at least the following steps is provided. A conductive electrode of a substrate holder is charged to have a first polarity to attract the particles having a second polarity in the semiconductor process chamber to move toward the substrate holder, where the first polarity is opposite to the second polarity. The conductive electrode of the substrate holder is changed to have the second polarity to attract the particles having the first polarity in the semiconductor process chamber to move toward the substrate holder. The particles having the second polarity and the particles having the first polarity are removed from the semiconductor process chamber.

According to some alternative embodiments, a method for removing particles from a semiconductor process chamber including at least the following steps is provided. The particles having a first polarity in the semiconductor process chamber are attracted to a surface of a particle-attaching member which is charged with a second polarity, where the particle-attaching member is adapted to move in a moving direction, and the first polarity is opposite to the second polarity. The particles having the first polarity are removed from the surface of the particle-attaching member by a cleaning member when the particle-attaching member moves in the moving direction and the surface of the particle-attaching member passes the cleaning member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing particles from a semiconductor process chamber, comprising:
accumulating electrical charges having a first polarity on a receiving surface of a wafer chuck by applying a voltage to the wafer chuck, wherein the wafer chuck in the semiconductor process chamber is configured to hold a semiconductor wafer to be processed on the receiving surface when performing a semiconductor process;
attracting the particles having a second polarity in the semiconductor process chamber to directly land on the receiving surface of the wafer chuck on which the electrical charges having the first polarity are accumulated, wherein the first polarity is opposite to the second polarity; and
removing the particles having the second polarity from the semiconductor process chamber.

2. The method of claim 1, further comprising:
after attracting the particles having the second polarity to directly land on the receiving surface of the wafer chuck, attracting the particles having the first polarity in the semiconductor process chamber to move toward the receiving surface of the wafer chuck by accumulating electrical charges having the second polarity on the receiving surface of the wafer chuck.

3. The method of claim 2, wherein:
controlling to change from accumulating the electrical charges having the first polarity on the receiving surface of the wafer chuck to accumulating the electrical charges having the second polarity on the receiving surface of the wafer chuck by using a time mode.

4. The method of claim 1, further comprising:
after attracting the particles, providing a gas flow through which the particles on the receiving surface of the wafer chuck are removed from the semiconductor process chamber.

5. The method of claim 1, wherein a conductive electrode is disposed inside the wafer chuck, and the voltage supplied by a power source is applied to the conductive electrode during the accumulating.

6. The method of claim 5, wherein when removing the particles having the second polarity from the semiconductor process chamber, a gas is provided to flow through the receiving surface of the wafer chuck after disconnecting the conductive electrode from the power source.

7. The method of claim 1, wherein when attracting the particles having the second polarity in the semiconductor process chamber, the semiconductor process chamber is in a vacuum environment.

8. The method of claim 1, further comprising:
changing from accumulating the electrical charges having the first polarity on the receiving surface of the wafer chuck to accumulating electrical charges having a second polarity on the receiving surface of the wafer chuck; and
providing a gas flowing through the receiving surface of the wafer chuck when removing the particles having the second polarity from the semiconductor process chamber, wherein changing to accumulating electrical charges having the second polarity on the receiving surface of the wafer chuck and providing the gas are performed during a same step.

9. A method for removing particles from a semiconductor process chamber, comprising:
charging a conductive electrode of a substrate holder to have a first polarity to attract the particles having a second polarity in the semiconductor process chamber to directly land on a receiving surface of the substrate holder, wherein the first polarity is opposite to the second polarity, wherein the substrate holder at a lower portion of the semiconductor process chamber is configured to hold a semiconductor wafer to be patterned thereon when performing a lithography process;

changing the conductive electrode of the substrate holder to have the second polarity to attract the particles having the first polarity in the semiconductor process chamber to directly land on the receiving surface of the substrate holder; and removing the particles having the second polarity and the particles having the first polarity from the semiconductor process chamber.

10. The method of claim 9, wherein removing the particles having the second polarity and the particles having the first polarity from the semiconductor process chamber comprises:

providing a gas flowing through the receiving surface of the substrate holder where the particles are attracted to.

11. The method of claim 9, wherein removing the particles having the second polarity and the particles having the first polarity from the semiconductor process chamber comprises:

exhausting the particles having the first polarity from the semiconductor process chamber after attracting the particles having the first polarity to directly land on the receiving surface of the substrate holder.

12. The method of claim 9, wherein changing the conductive electrode of the substrate holder to have the second polarity is controlled by a time mode.

13. The method of claim 9, wherein when changing the conductive electrode of the substrate holder to have the second polarity, a gas is provided to flow through the receiving surface of the substrate holder.

14. The method of claim 9, wherein removing the particles comprises providing a gas to flow through the receiving surface of the substrate holder after disconnecting the conductive electrode from a power source.

15. The method of claim 9, wherein when attracting the particles, the semiconductor process chamber is in a vacuum environment.

16. A method, comprising:

performing a semiconductor process onto a semiconductor wafer which is held on a receiving surface of a wafer chuck in a semiconductor process chamber;

transferring the semiconductor wafer that has been processed out of the semiconductor process chamber; and performing a cleaning process after the transferring, and performing the cleaning process comprising:

moving particles suspended in the semiconductor process chamber down to the receiving surface of the wafer chuck comprising:

directly landing a portion of the particles having a positive polarity on the receiving surface of the wafer chuck when a conductive electrode in the wafer chuck is negatively charged; and directly landing another portion of the particles having a negative polarity on the receiving surface of the wafer chuck when the conductive electrode in the wafer chuck is positively charged, wherein:

the portion of the particles having the positive polarity is attracted to the receiving surface on which electrical charges having the negative polarity are accumulated, and the another portion of the particles having the negative polarity is attracted to the receiving surface on which electrical charges having the positive polarity are accumulated.

17. The method of claim 16, wherein the cleaning process is performed in a vacuum environment.

18. The method of claim 16, wherein performing the cleaning process further comprises:

changing a polarity of the receiving surface of the wafer chuck;

introducing a gas flow to bring the particles away from the receiving surface of the wafer chuck during the changing; and exhausting the gas flow along with the particles.

19. The method of claim 16, wherein performing the semiconductor process comprises performing a lithography process onto the semiconductor wafer.

20. The method of claim 16, further comprising:

controlling the conductive electrode in the wafer chuck to change from being negatively charged to positively charged by using a time mode.

* * * * *